(12) United States Patent
Chou et al.

(10) Patent No.: US 12,119,307 B2
(45) Date of Patent: Oct. 15, 2024

(54) INTEGRATED SELF-ALIGNED ASSEMBLY

(71) Applicant: ROCKLEY PHOTONICS LIMITED, Altrincham (GB)

(72) Inventors: Chia-Te Chou, Brea, CA (US); Brett Sawyer, Pasadena, CA (US); David McCann, Pasadena, CA (US)

(73) Assignee: Rockley Photonics Limited, Altrincham (GB)

( * ) Notice: Subject to any disclaimer, the term of this patent is extended or adjusted under 35 U.S.C. 154(b) by 25 days.

(21) Appl. No.: 17/504,125

(22) Filed: Oct. 18, 2021

(65) Prior Publication Data
US 2022/0122924 A1    Apr. 21, 2022

Related U.S. Application Data

(60) Provisional application No. 63/093,729, filed on Oct. 19, 2020.

(51) Int. Cl.
*H01L 23/544* (2006.01)
*H01L 23/00* (2006.01)
*H01L 25/065* (2023.01)

(52) U.S. Cl.
CPC .......... *H01L 23/544* (2013.01); *H01L 24/13* (2013.01); *H01L 24/16* (2013.01); *H01L 24/17* (2013.01); *H01L 25/0655* (2013.01); *H01L 2223/54426* (2013.01); *H01L 2224/1301* (2013.01); *H01L 2224/16167* (2013.01); *H01L 2224/17517* (2013.01); *H01L 2924/146* (2013.01); *H01L 2924/15323* (2013.01)

(58) Field of Classification Search
CPC .................... H01L 23/544; H01L 2223/54426
See application file for complete search history.

(56) References Cited

U.S. PATENT DOCUMENTS

| 6,872,630 | B1 * | 3/2005 | Chen ...................... | G03F 9/7084 257/E23.179 |
| 10,598,875 | B2 * | 3/2020 | Xie ........................ | G02B 6/3897 |
| 2002/0084565 | A1 * | 7/2002 | Dautartas ............... | G02B 6/423 269/902 |
| 2003/0094706 | A1 * | 5/2003 | Howarth ............... | H01L 23/544 257/E23.179 |
| 2003/0094707 | A1 * | 5/2003 | Howarth ............... | H01L 23/544 257/E23.179 |

(Continued)

FOREIGN PATENT DOCUMENTS

DE        102019132335 A1 *  6/2020  ............. H01L 21/52

OTHER PUBLICATIONS

Jo, P. K. et al., "Dense and Highly Elastic Compressible MicroInterconnects (CMIs) for Electronic Microsystems", 2017 IEEE 67th Electronic Components and Technology Conference, 2017, pp. 684-689, IEEE.

*Primary Examiner* — Victor A Mandala
*Assistant Examiner* — Lawrence C Tynes, Jr.
(74) *Attorney, Agent, or Firm* — Lewis Roca Rothgerber Christie LLP

(57) ABSTRACT

An assembly. In some embodiments, the assembly includes a first semiconductor chip, a substrate, and a first alignment element. The alignment of the first semiconductor chip and the substrate may be determined at least in part by engagement of the first alignment element with a first recessed alignment feature, in a surface of the first semiconductor chip.

22 Claims, 10 Drawing Sheets

(56) References Cited

U.S. PATENT DOCUMENTS

| | | | | |
|---|---|---|---|---|
| 2012/0025209 | A1* | 2/2012 | Kim | G02B 6/4292 |
| | | | | 257/E33.077 |
| 2013/0279844 | A1* | 10/2013 | Na | G02B 6/124 |
| | | | | 438/27 |
| 2015/0309269 | A1* | 10/2015 | Daikuhara | G02B 6/4281 |
| | | | | 385/14 |
| 2017/0084545 | A1* | 3/2017 | Seddon | H01L 21/4853 |
| 2019/0137706 | A1* | 5/2019 | Xie | G02B 6/4202 |
| 2021/0325618 | A1* | 10/2021 | Leigh | G02B 6/4292 |

* cited by examiner

INTEGRATED SELF-ALIGNED ASSEMBLY

CROSS-REFERENCE TO RELATED APPLICATION(S)

The present application claims priority to and the benefit of U.S. Provisional Application No. 63/093,729, filed Oct. 19, 2020, entitled "INTEGRATED SELF ALIGNED LGA OPTICAL ENGINE", the entire content of which is incorporated herein by reference.

FIELD

One or more aspects of embodiments according to the present disclosure relate to circuit assemblies, and more particularly to a system and method for aligning circuits connected by a connector.

BACKGROUND

A high-density electrical interconnect, such as fine-pitch land grid array (LGA) using a socket, may require relatively accurate alignment between the components on both sides. For example, if an integrated circuit is to be connected to a substrate through such an interconnect, then relatively accurate alignment between the integrated circuit and the substrate may be required to ensure that each LGA pad of the integrated circuit is reliably connected to the corresponding pad of the substrate and is not also, or instead, connected to another LGA pad (e.g., an adjacent LGA pad) on the substrate.

Thus, there is a need for a system and method for aligning electronic components that are to be connected together.

SUMMARY

According to an embodiment of the present disclosure, there is provided an assembly, including: a first semiconductor chip; a substrate; and a first alignment element, wherein the alignment of the first semiconductor chip and the substrate is determined at least in part by engagement of the first alignment element with a first recessed alignment feature, in a surface of the first semiconductor chip.

In some embodiments, the first recessed alignment feature has a face aligned with a crystalline plane of the first semiconductor chip.

In some embodiments, the first recessed alignment feature has the shape of a pyramid or of a truncated pyramid.

In some embodiments, the first recessed alignment feature has the shape of a V-groove or of a truncated V-groove.

In some embodiments, the first alignment element is a cylindrical pin having a first end secured in a hole in the substrate.

In some embodiments, a second end of the cylindrical pin is hemispherical and engages the first recessed alignment feature.

In some embodiments, the first semiconductor chip is a photonic integrated circuit having an optical interface and an electrical interface, the photonic integrated circuit being configured to convert optical signals to electrical signals or to convert electrical signals to optical signals.

In some embodiments, the assembly further includes an interface integrated circuit connected to the electrical interface of the photonic integrated circuit, and connected, through a land grid array and through a socket, to the substrate.

In some embodiments, the first recessed alignment feature has the shape of a pyramid or of a truncated pyramid.

In some embodiments, the first recessed alignment feature has the shape of a V-groove or of a truncated V-groove.

In some embodiments, the assembly further includes a photonic integrated circuit, wherein: the photonic integrated circuit has an optical interface and an electrical interface, and is configured to convert optical signals to electrical signals or to convert electrical signals to optical signals.

In some embodiments, the assembly includes an interface integrated circuit connected to the electrical interface of the photonic integrated circuit, and connected, through land grid array and through a socket, to the substrate.

In some embodiments, the alignment element is a cylindrical pin extending through the socket and having a first end secured in a hole in the substrate.

In some embodiments: the first semiconductor chip is a carrier; and the interface integrated circuit and the photonic integrated circuit are secured to the carrier.

In some embodiments, the photonic integrated circuit has an active surface facing the carrier, and a second alignment element engages: a second recessed alignment feature, in the photonic integrated circuit, and a third recessed alignment feature, in the carrier.

In some embodiments, the first recessed alignment feature has the shape of a pyramid or of a truncated pyramid.

In some embodiments, the first recessed alignment feature has the shape of a V-groove or of a truncated V-groove.

In some embodiments, the second recessed alignment feature has the shape of a pyramid or of a truncated pyramid.

In some embodiments, the second recessed alignment feature has the shape of a V-groove or of a truncated V-groove.

In some embodiments, an angle between a sloped surface of the second alignment feature and the active surface is between 50 degrees and 60 degrees.

BRIEF DESCRIPTION OF THE DRAWINGS

These and other features and advantages of the present disclosure will be appreciated and understood with reference to the specification, claims, and appended drawings wherein:

Each of FIGS. 3A-3D and 5-7 is drawn to scale for a respective embodiment.

DETAILED DESCRIPTION

The detailed description set forth below in connection with the appended drawings is intended as a description of exemplary embodiments of a system and method for aligning circuits provided in accordance with the present disclosure and is not intended to represent the only forms in which the present disclosure may be constructed or utilized. The description sets forth the features of the present disclosure in connection with the illustrated embodiments. It is to be understood, however, that the same or equivalent functions and structures may be accomplished by different embodiments that are also intended to be encompassed within the scope of the disclosure. As denoted elsewhere herein, like element numbers are intended to indicate like elements or features.

Some embodiments of the present invention include an optical engine (OE) with a land grid array (LGA) interconnect for co-packaged optics (CPO) for a digital application-specific integrated circuit (ASIC) (e.g., a switch ASIC). Related art approaches use fan out wafer level packaging to realize a flip chip optical engine that includes a ball grid array interconnect (BGA). The BGA interconnect may be used both for mechanical alignment and as an electrical interconnect.

In some embodiments, anisotropic etch features in silicon are used to align optical engines to an organic substrate. In some embodiments, the design of the assembly eliminates the BGA and (in part because the balls of the BGA may contribute significantly to the length of the electrical paths through a BGA) may improve electrical and mechanical performance. An etched alignment feature is fabricated on the photonic integrated circuit (PIC) (and, in some embodiments, on a carrier) using lithography techniques. In doing so, mechanical alignment tolerance is reduced (i.e., mechanical alignment is made more accurate, making it possible to meet tighter tolerances) and electrical loss from the optical engine to the digital ASIC is reduced. In some embodiments, optoelectronic packaging costs are reduced, electrical performance is improved and it is possible to achieve tighter mechanical alignment tolerances in assembly.

In some embodiments, packaging cost is reduced by eliminating package fabrication processes—most notably BGA—as well as by improving optical engine yield for optical engines with throughputs of 3.2 Tb/s or more. Electrical performance is improved by reducing impedance discontinuity, that in a BGA-based assembly is introduced by the BGA electrical interconnect. Assembly tolerances are reduced by using lithographically defined alignment features.

Figure 1:
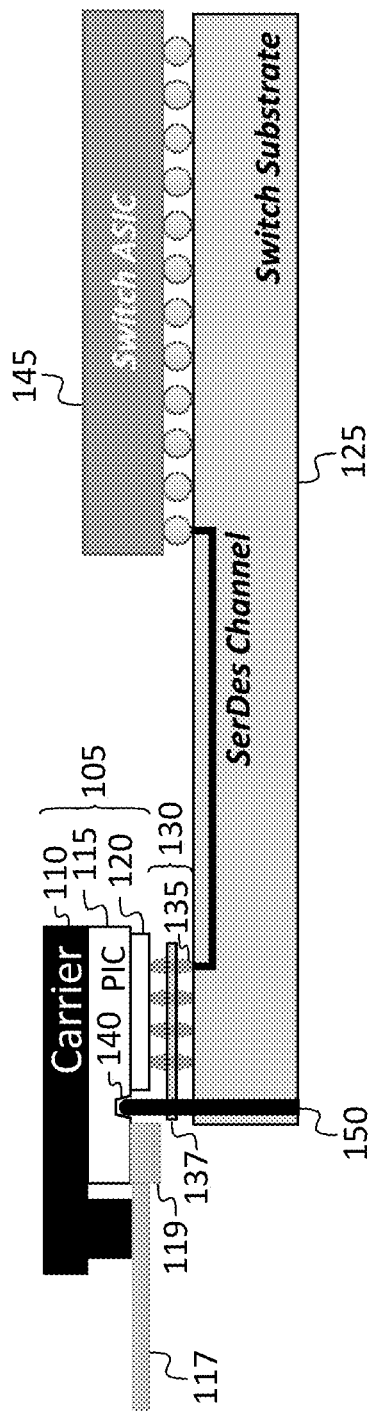
FIG. 1 is a schematic cross-sectional view of an assembly, according to an embodiment of the present disclosure.

As shown in FIG. 1, the optical engine (OE) 105 (which includes a carrier 110, the PIC 115, and an interface integrated circuit (IC) 120) is flip-chip assembled to an organic substrate 125. Each of the PIC 115 and the interface IC 120 may be or include a semiconductor chip which may have an "active" surface, on which components or features (e.g., waveguides, active optical elements, or transistors may be formed, e.g., using photolithographic processes). The lower surface may be the active surface of the PIC 115. The lower surface of the PIC 115 may include V-grooves for aligning and securing optical fibers (or "fiber pigtails") 117 and a fiber attach block 119 may be attached to the lower surface, to hold the optical fibers 117 in the V-grooves. The lower surface of the PIC 115 may further include active optical elements (e.g., photodetectors or modulators) and waveguides (some of which may be tapered, forming mode converters) for coupling light between the optical fibers 117 and the active optical elements. The PIC 115 may have an optical interface (via optical fibers 117) and an electrical interface (via connections, between the active surface of the PIC 115 and the active surface of the interface IC 120), and it may be configured to convert optical signals to electrical signals or to convert electrical signals to optical signals.

The interface IC 120 may include (i) circuits for interfacing active optical elements (e.g., photodetectors or modulators) in the PIC 115 with a data connection (e.g., one or more serial digital data channels) and (ii) a plurality of through-silicon vias (TSVs) for making connections between the upper (active) surface of the interface IC 120 and the lower surface of the interface IC 120 (e.g., to a land grid array (LGA) on the lower surface of the interface IC 120, as discussed in further detail below). The electrical interface between the interface IC 120 and the organic substrate 125 (e.g., between the LGA on the lower surface of the interface IC 120 and an LGA on the upper surface of the organic substrate 125) is a co-packaged optics (CPO) socket 130 which is similar to LGA/BGA test sockets, and which may include a plurality of electrically conductive paths 135 (e.g., conductors, such as socket pins 135, held in place by a socket insulator 137) extending from a first surface of the socket to a second surface of the socket (e.g., in the orientation of FIG. 1, a plurality of substantially vertical electrically conductive paths 135 each extending from the top surface of the socket to the bottom surface of the socket). The optical engine 105 may be clamped to the substrate with a lever (not shown).

Figure 2:
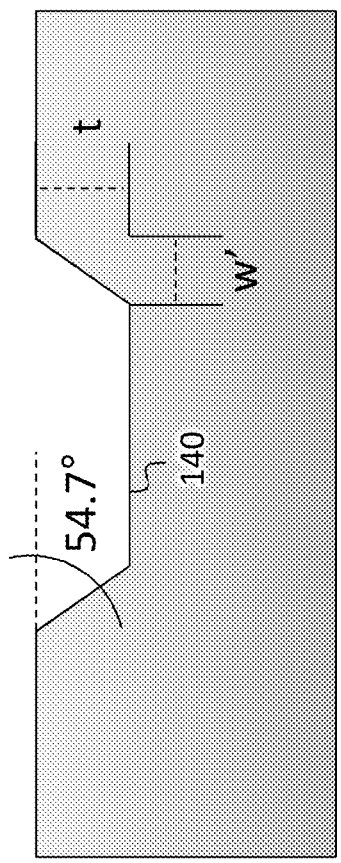
FIG. 2 is a cross-sectional view of a recessed alignment feature, according to an embodiment of the present disclosure.

The digital ASIC 145 may be secured to (e.g., soldered to) the organic substrate 125, which may include conductive traces forming connections between the socket 130 and the digital ASIC 145. Alignment between the signal pads of the optical engine 105 (e.g., the LGA pads on the lower surface of the interface IC 120) and the LGA pads of the organic substrate 125 may achieved using an alignment feature 140 etched into the photonic integrated circuit (PIC). The alignment feature 140, an enlarged cross-sectional view of which is shown in FIG. 2, is lithographically defined using techniques (e.g., anisotropic etch techniques, which may produce alignment features 140 having faces parallel to crystalline planes of the semiconductor chip in which they are formed) similar to those used to fabricate the V-groove for passive fiber alignment. In some embodiments, the (square or rectangular) mask opening and etch time are such that a recess having a flat bottom (as shown in FIG. 2) is formed, due to the use of a shorter anisotropic etch time than the time necessary to form a V-groove (or pyramidal recess). In some embodiments, the etch time is sufficiently great that a pyramidal recess is formed (i.e., so that the flat bottom shown in FIG. 2 is absent). Each of one or more alignment pins 150, each secured in a respective hole in the organic substrate 125, extends through the socket 130 (or adjacent to the socket 130) and has a round (e.g., hemispherical) end that may abut against one or more of the sloped surfaces of a corresponding alignment feature 140.

The pins 150 may operate as alignment elements for passively aligning the PIC 115 and the organic substrate 125. As used herein, an "alignment element" is an element, such as an alignment pin or a sphere (as discussed in further detail below) that fits into a recessed alignment feature and thereby constrains the position of the recessed alignment feature relative to the alignment element. For example, the hemispherical end of an alignment pin 150 may be in contact with one or more of the sloped surfaces of a recessed alignment feature 140 in the PIC 115, and may thereby prevent the PIC 115 from moving laterally during assembly. An alignment feature need not contact a surface of the corresponding alignment feature 140 to operate as an alignment element; for example, if the hemispherical end of an alignment pin 150 is perfectly centered within a recessed alignment feature 140 of the PIC 115 and a small gap exists between each of the surfaces of the recessed alignment feature 140 of the PIC 115 and the end of the alignment pin 150, the alignment pin 150 may nonetheless constrain the position of the recessed alignment feature 140 relative to the alignment pin 150, by preventing the alignment feature 140 from moving by more than the widths of the gaps.

Including one or more alignment features 140 in the active surface of the PIC 115 may reduce the overall form factor of the optical engine 105 and result in tighter alignment tolerances than those associated with other methods such as machined dowels or pins in the carrier 110. The alignment feature 140 also enables the use of a land grid array (LGA) package and thereby improves electrical performance by shortening the electrical interconnect between the optical engine 105 and, e.g., an extremely short reach (XSR) switch block that may be in the digital ASIC 145.

Figure 3A:
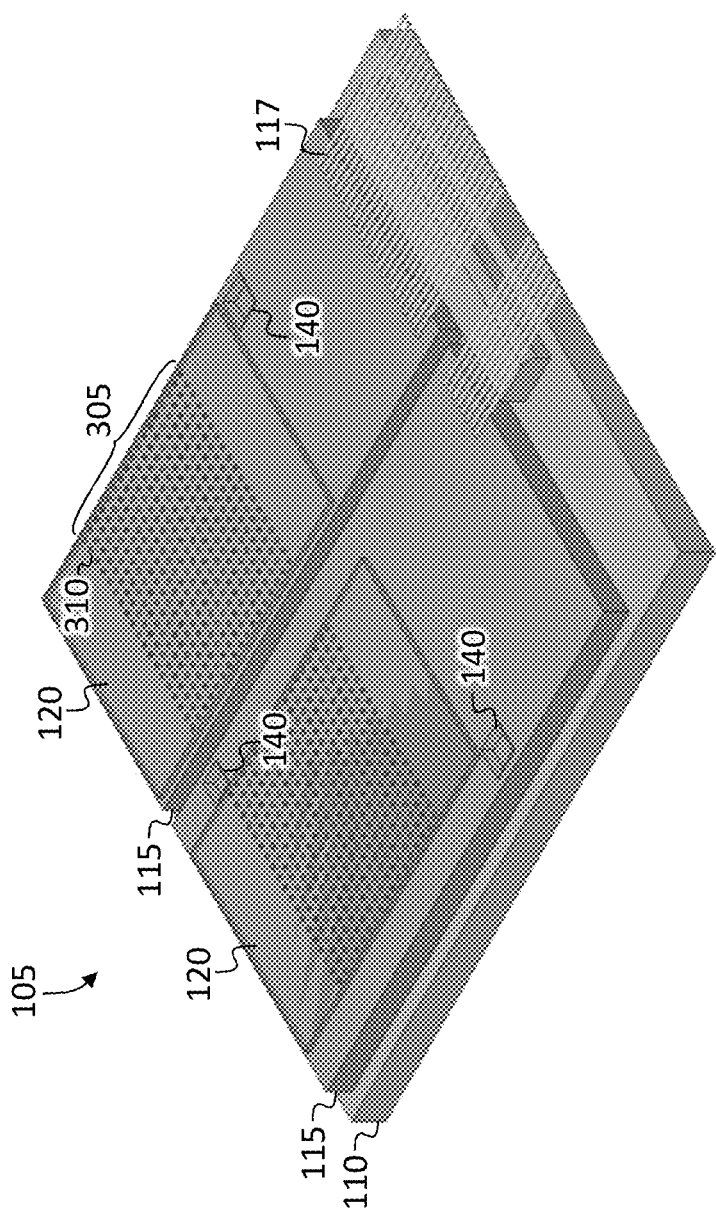
FIG. 3A is a perspective view of an assembly, according to an embodiment of the present disclosure.

FIG. 3A is a perspective view of an as-assembled optical engine 105 (e.g., a 3.2 Tb/s optical engine) including two PICs 115 on a carrier 110 (shared by the two PICs 115), taken from a direction from which the lower surfaces of the PICs 115 and the alignment features 140 are visible, as well as two interface ICs 120 (each being connected to, and forming an electrical interface to, a respective one of the two PICs 115). Each of the interface ICs 120 has a land grid array (LGA) 305, each LGA 305 including a plurality of LGA pads 310 arranged in an array as shown. Optical fibers 117 are secured along an edge of each of the PICs 115. The optical engine 105 may include a transmit subassembly (including a first PIC 115 and a first interface IC 120 connected to the first PIC 115) and a receive subassembly (including a second PIC 115 and a second interface IC 120 connected to the second PIC 115); the first (transmitting) PIC may have a larger number of optical fibers 117 in part because some of the optical fibers 117 may receive unmodulated light from lasers (not shown); this unmodulated light may be modulated by modulators on the first PIC 115. The second PIC 115 may include a plurality of photodetectors for detecting modulated light received through the optical fibers 117 connected to the second PIC 115.

Figure 3B:
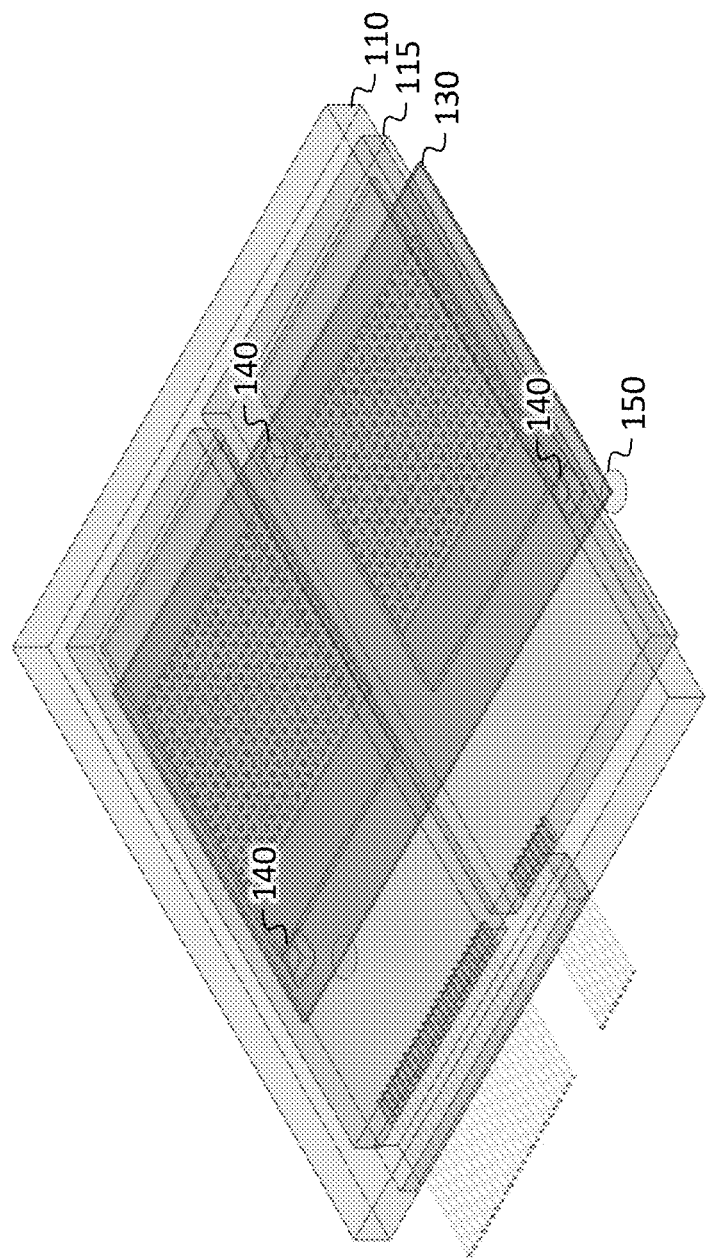
FIG. 3B is a transparent perspective view of an assembly, according to an embodiment of the present disclosure.

FIG. 3B is a transparent top perspective view of the optical engine 105 as well as the socket 130. In FIG. 3B, the alignment pins 150 are drawn as circles (which appear as ellipses in the perspective view), instead of being drawn as cylindrical pins with hemispherical upper ends, for ease of illustration. In some embodiments, each optical engine 105 has three alignment features 140 as shown. In some embodiments, to avoid over-constraining the location of the optical engine 105, only two alignment features 140 may be present or one of the alignment features may have the shape of a V-groove (or of a truncated V-groove, i.e., a V-groove with a flat bottom) instead of having the shape of a pyramid or of a truncated pyramid (as shown). A recess in the shape of a pyramid or of a truncated pyramid may be fabricated using an anisotropic etch with a mask that is square (or rectangular and nearly square), and a recess in the shape of a V-groove or of a truncated V-groove may be fabricated using an anisotropic etch with a mask that is an elongated rectangle. The LGAs shown in the embodiments of FIGS. 3A-3D, 5 and 7 may have a 400 um pitch. In some embodiments the LGA pitch may be different, e.g., it may be 350 um or less.

Figure 3C:
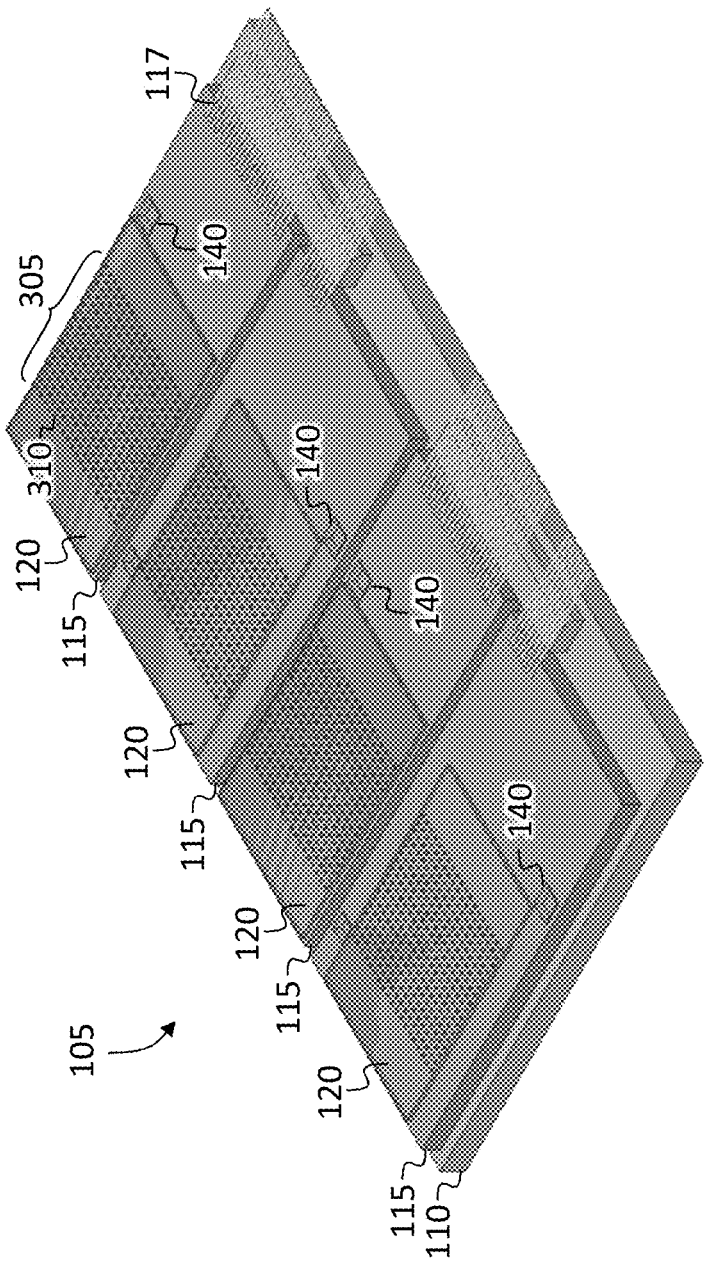
FIG. 3C is a perspective view of an assembly, according to an embodiment of the present disclosure.
Figure 3D:
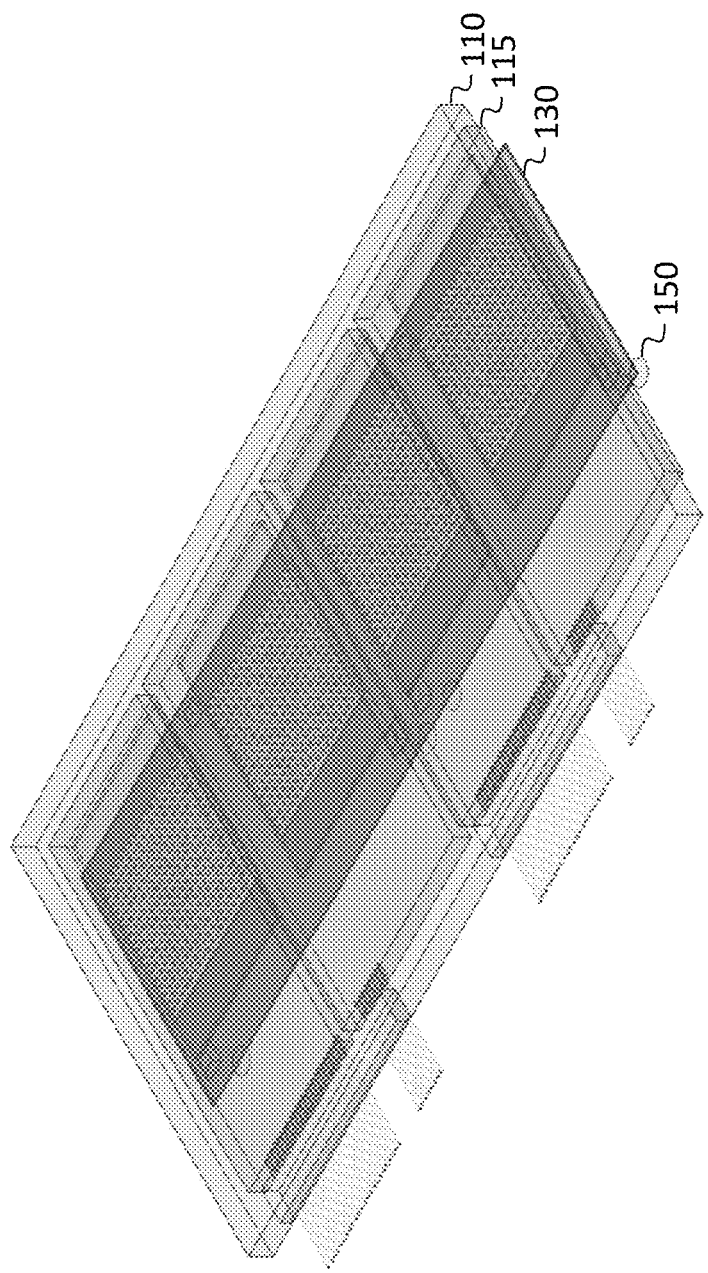
FIG. 3D is a transparent perspective view of an assembly, according to an embodiment of the present disclosure.

Another embodiment for a high bandwidth (e.g., 6.4 Tb/s) optical engine 105 is shown in FIG. 3C. As in the 3.2 Tb/s LGA optical engine of FIGS. 3A and 3B, receive and transmit subassemblies are integrated on a common carrier. This embodiment leverages optical subassembly yield improvements associated with this integration method to realize a scalable, small form factor, high bandwidth optical engine 105. In doing so, optical engine bandwidth is increased by integrating two or more receive subassemblies with two or more transmit subassemblies on a common carrier 110. This high bandwidth optical engine 105 may be flip-chip assembled to an organic substrate 125 using similar alignment and electrical interconnects as the optical engine 105 shown in the embodiment of FIG. 3A. FIG. 3D is a transparent top perspective view of the optical engine 105 of FIG. 3C as well as the socket 130, which is shared by all four of the subassemblies (i.e., by the two receive subassemblies and the two transmit subassemblies).

Figure 4:
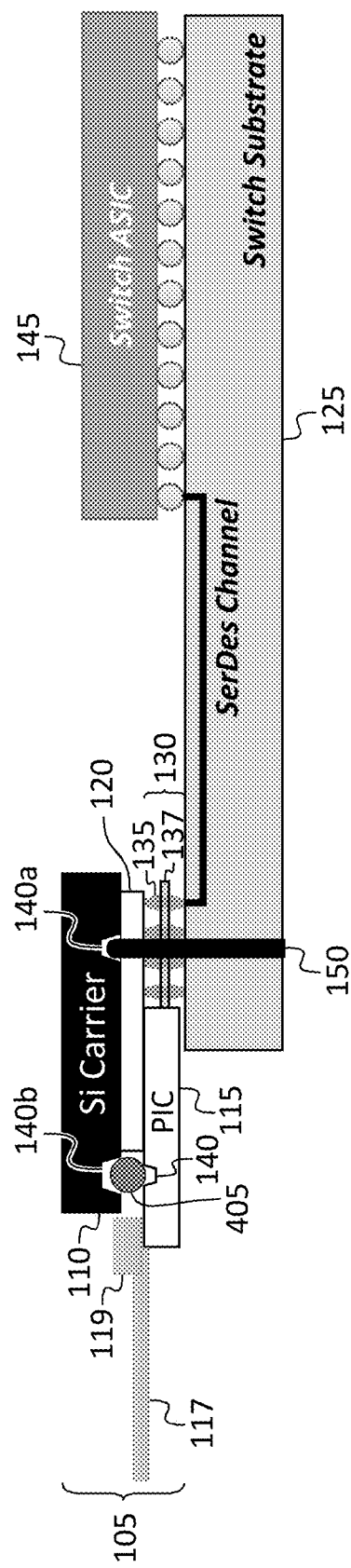
FIG. 4 is a schematic cross-sectional view of an assembly, according to an embodiment of the present disclosure.

In the embodiment of FIG. 4, the carrier 110 is a semiconductor chip that has one or more first recessed alignment features 140a (e.g., anisotropically etched recesses (e.g., recesses in the shape of pyramids or truncated pyramids)), in a portion of the lower surface of the carrier 110 that is not covered by the PIC 115. As in the embodiment of FIGS. 1-3D, the organic substrate 125 may include one or more alignment pins 150. In the embodiment of FIG. 4, these alignment pins 150 may engage the first recessed alignment features 140a to provide passive alignment between the organic substrate 125 and the carrier 110. The carrier 110 may further have one or more second recessed alignment features 140b each opposite a respective alignment feature on the PIC 115, and the PIC 115 may be passively aligned to the carrier 110 by alignment elements 405 each of which engages a second alignment feature 140b in the carrier 110 and a corresponding alignment feature 140 in the PIC 115. The first recessed alignment features 140a and the second recessed alignment features 140b may collectively be referred to (along with the alignment features of the PIC) simply as alignment features 140, or as recessed alignment features 140. The interface IC 120 (which may be an IC in a fanout package), which is secured to (and aligned to) the PIC 115, may be passively aligned to the organic substrate 125 as a result (i) of the passive alignment of the PIC 115 to the carrier 110 and (ii) of the passive alignment of the carrier 110 to the organic substrate 125.

Each alignment element 405 for aligning the PIC 115 and the carrier 110 may be a sphere (as shown) (e.g., a sphere having a diameter between 500 microns and 1000 microns), or it may have another shape, e.g., the shape of a cylindrical puck. The carrier 110 may be composed of crystalline silicon so that, e.g., a wet etch in potassium hydroxide (KOH) may be employed as the anisotropic etch that forms the alignment features 140. The sphere may have between 30% and 60% (e.g., about 50%) of its diameter extend into the alignment feature 140 on the carrier side, and it may have 15% to 40% (e.g., between 20% and 30%) of its diameter extending into the alignment feature 140 on the PIC side.

As in the embodiment of FIGS. 1-3D, the number and shapes of the alignment features may be selected to avoid over-constraining the alignment between the PIC 115 and the carrier 110, and to avoid over-constraining the alignment between the carrier 110 and the organic substrate 125. For example, the arrangement of alignment features in the PIC 115 may be selected to constrain the three degrees of freedom that determine lateral, or in-plane, alignment (including two translational degrees of freedom parallel to the plane and a rotational degree of freedom for rotation about an axis perpendicular to the plane). To this end, a first alignment feature that is a recess in the shape of a pyramid (or of a truncated pyramid) may be used to constrain the two translational degrees of freedom parallel to the plane, and a V-groove, that is not perpendicular to the line between (i) the pyramid and (ii) the point of contact of the alignment element with the V-groove, may be used to constrain the rotational degree of freedom for rotation about an axis perpendicular to the plane.

In the embodiment of FIG. 4, the upper surface of the PIC 115 may be the active surface of the PIC 115, which may include V-grooves for aligning and securing optical fibers (or "fiber pigtails") 117 and to which a fiber attach block 119 may be attached, to hold the optical fibers 117 in the V-grooves. As in the embodiment of FIG. 1, the active surface of the PIC 115 may further include active optical elements (e.g., photodetectors or modulators) and waveguides (some of which may be tapered, forming mode converters) for coupling light between the optical fibers 117 and the active optical elements. The interface IC 120 may be bonded to the carrier 110 by a thermal epoxy.

Figure 5:
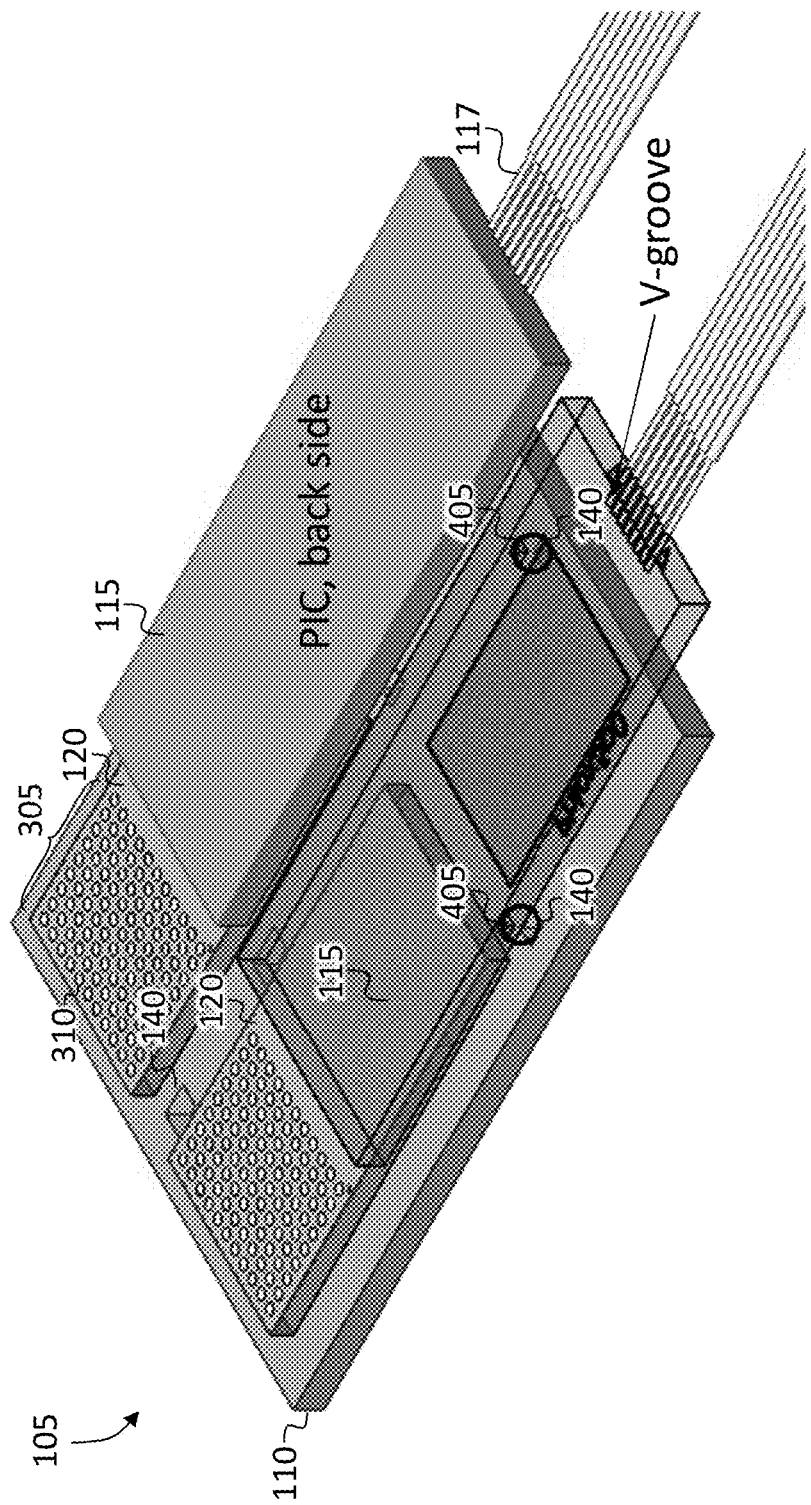
FIG. 5 is a partially transparent perspective view of an assembly, according to an embodiment of the present disclosure.
Figure 6A:
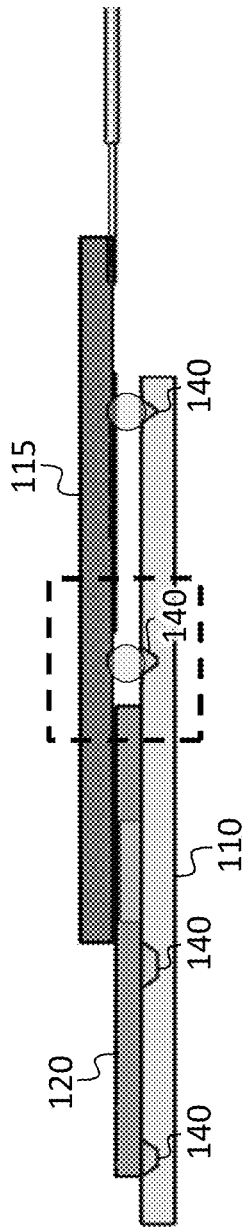
FIG. 6A is a cross-sectional view of an assembly, according to an embodiment of the present disclosure.
Figure 6B:
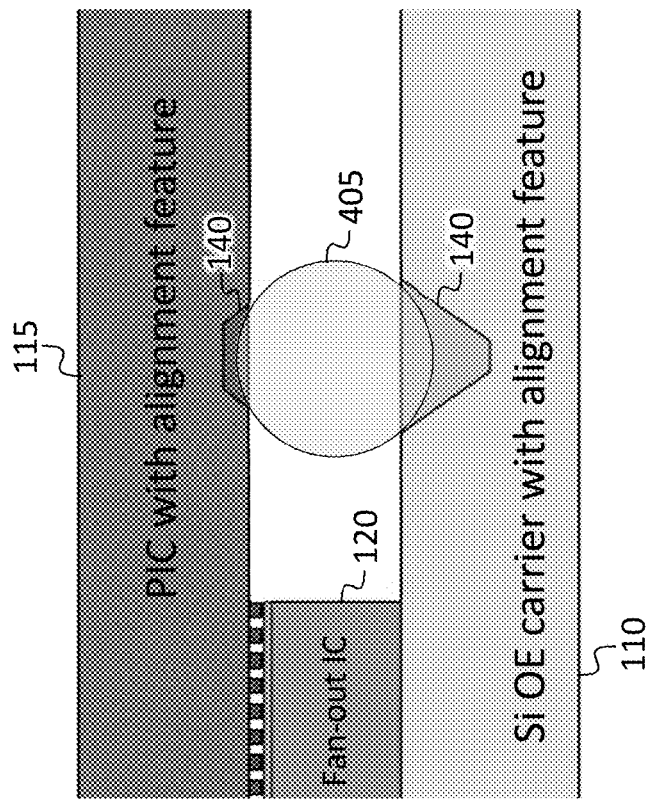
FIG. 6B is an enlarged view of a portion of FIG. 5A, according to an embodiment of the present disclosure.
Figure 7:
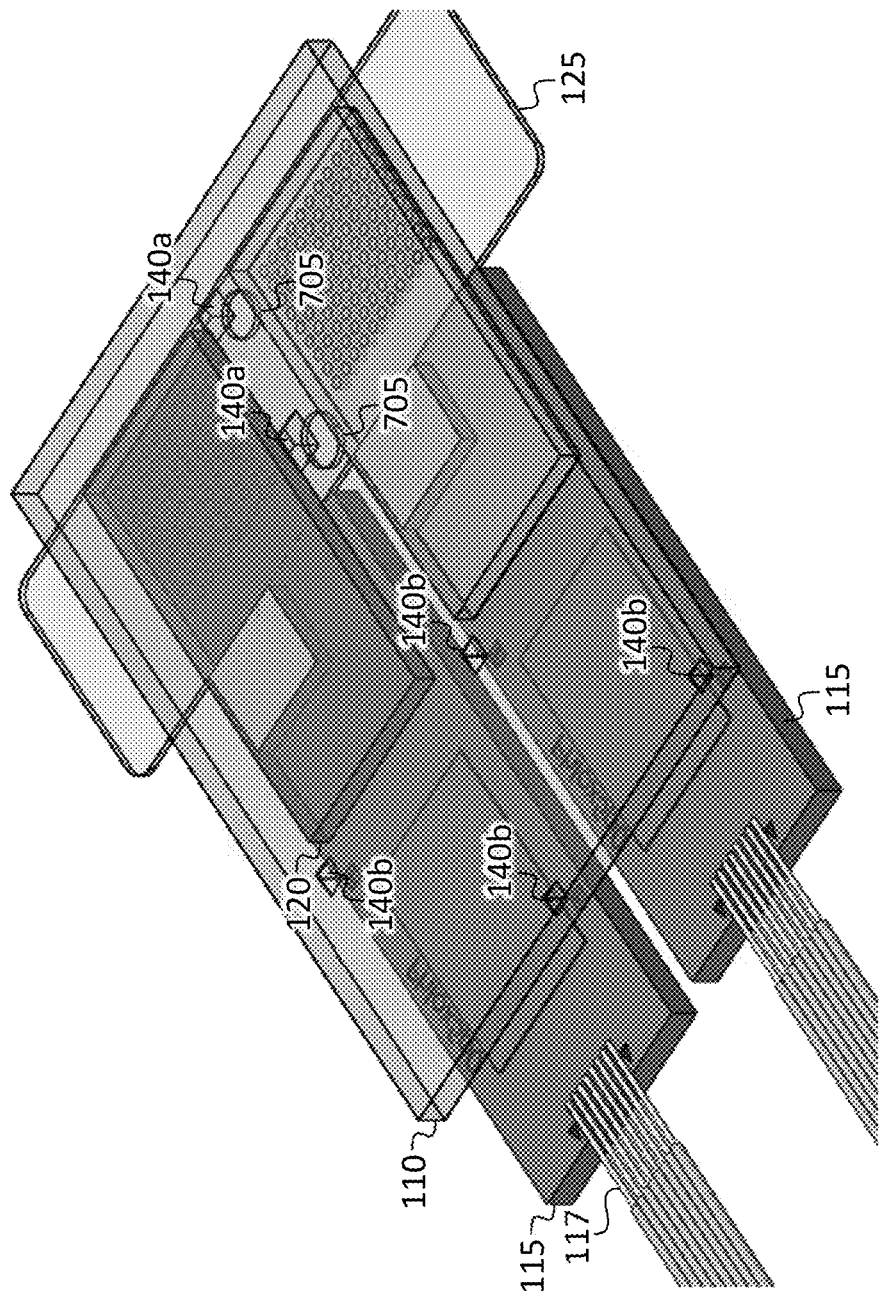
FIG. 7 is a transparent perspective view of an assembly, according to an embodiment of the present disclosure.

FIG. 5 shows a partially transparent perspective view of an optical engine 105 according to the embodiment of FIG. 4. FIGS. 6A and 6B are cross-sectional views of the embodiment of FIG. 5, showing spheres 405 each operating as an alignment element, each of which may engage, to this end, (i) a corresponding alignment feature 140 in the PIC 115 and (ii) a corresponding alignment feature 140 in the carrier 110. FIG. 7 is a partially transparent perspective view of an optical engine 105 and a substrate 125. Holes 705 in the substrate operate as alignment features into which alignment pins 150 may be pressed. FIG. 7 also shows, in the carrier 110, (i) two first alignment features 140a that the alignment pins 150 may engage for aligning the carrier 110 to the organic substrate 125, and (ii) four second alignment features 140b that alignment elements (e.g., spheres 405) may engage for aligning the carrier 110 to the PICs 115.

In the area of overlap between the PIC 115 and the interface IC 120, the PIC 115 and the interface IC 120 may be secured together and electrically connected through a plurality of metal bumps. For example, a plurality of solder-topped copper pillar bumps (e.g. Cu/Ni/SnAg bumps) may be formed on the active surface of the PIC 115, and a corresponding plurality of pads (e.g., Ni/Au pads) may be formed on the active surface of the interface IC 120; the PIC 115 may then be soldered to the interface IC 120, with each solder-topped copper pillar bump of the PIC 115 in the area of overlap being soldered to a respective pad on the interface IC 120. The soldering may be performed, for example, using thermocompression bonding.

In some embodiments, the PIC 115 and the interface IC 120 may be aligned to each other, during assembly of the PIC 115 and the interface IC 120, by pairs of alignment features and respective alignment elements (e.g., spheres) (each pair including a recessed alignment feature in the PIC 115 and a corresponding recessed alignment feature in the interface IC 120, and each respective alignment element engaging both the recessed alignment feature in the PIC 115 and the corresponding recessed alignment feature in the interface IC 120). Similarly, in some embodiments pairs of recessed alignment features may be used to provide passive alignment of an integrated circuit to (i) another integrated circuit to which it is being flip-chip mounted or to (ii) a substrate, regardless of whether the integrated circuit is a photonic integrated circuit or an electronic integrated circuit.

In some embodiments, each of the pins in the organic substrate 125 that operate as alignment elements may engage a recessed alignment feature 140 in the interface IC 120, instead of engaging a recessed alignment feature 140 in the carrier 110. In such an embodiment the carrier 110 may be absent, or a separate carrier may be used for each PIC 115 and interface IC 120, or the carrier (or its bond to the interface IC 120) may be sufficiently compliant to absorb any differences in alignment between the PICs 115 and interface ICs 120 installed on it.

As used herein, and "integrated circuit", e.g., the PIC 115 or the interface IC 120, may be either a bare die or a packaged integrated circuit (e.g., the interface IC 120, in the form of a fanout package containing the interface IC die, is an integrated circuit as that term is used herein).

As used herein, "a portion of" something means "at least some of" the thing, and as such may mean less than all of, or all of, the thing. As such, "a portion of" a thing includes the entire thing as a special case, i.e., the entire thing is an example of a portion of the thing. Similarly, "in part" means "at least in part"; as such, if, for example, a first thing is in part the cause of a second thing, then the first thing may be the entire cause of the second thing, or other causes may also contribute. As used herein, when a second quantity is "within Y" of a first quantity X, it means that the second quantity is at least X−Y and the second quantity is at most X+Y. As used herein, when a second number is "within Y %" of a first number, it means that the second number is at least (1−Y/100) times the first number and the second number is at most (1+Y/100) times the first number. As used herein, the word "or" is inclusive, so that, for example, "A or B" means any one of (i) A, (ii) B, and (iii) A and B.

As used herein, when a method (e.g., an adjustment) or a first quantity (e.g., a first variable) is referred to as being "based on" a second quantity (e.g., a second variable) it means that the second quantity is an input to the method or influences the first quantity, e.g., the second quantity may be an input (e.g., the only input, or one of several inputs) to a function that calculates the first quantity, or the first quantity may be equal to the second quantity, or the first quantity may be the same as (e.g., stored at the same location or locations in memory as) the second quantity.

As used herein, the term "major component" refers to a component that is present in a composition, polymer, or product in an amount greater than an amount of any other single component in the composition or product. In contrast, the term "primary component" refers to a component that makes up at least 50% by weight or more of the composition, polymer, or product. As used herein, the term "major portion", when applied to a plurality of items, means at least half of the items. As used herein, any structure or layer that is described as being "made of" or "composed of" a substance should be understood (i) in some embodiments, to contain that substance as the primary component or (ii) in some embodiments, to contain that substance as the major component.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" or "between 1.0 and 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Similarly, a range described as "within 35% of 10" is intended to include all subranges between (and including) the recited minimum value of 6.5 (i.e., (1−35/100) times 10) and the recited maximum value of 13.5 (i.e., (1+35/100) times 10), that is, having a minimum value equal to or greater than 6.5 and a maximum value equal to or less than 13.5, such as, for example, 7.4 to 10.6. Any maximum numerical limitation recited herein is intended to include all lower numerical limitations subsumed therein and any minimum numerical limitation recited in this specification is intended to include all higher numerical limitations subsumed therein.

It will be understood that when an element is referred to as being "directly connected" or "directly coupled" to another element, there are no intervening elements present. As used herein, "generally connected" means connected by an electrical path that may contain arbitrary intervening elements, including intervening elements the presence of which qualitatively changes the behavior of the circuit. As used herein, "connected" means (i) "directly connected" or (ii) connected with intervening elements, the intervening elements being ones (e.g., low-value resistors or inductors, or short sections of transmission line) that do not qualitatively affect the behavior of the circuit.

Although exemplary embodiments of a system and method for aligning circuits have been specifically described and illustrated herein, many modifications and variations will be apparent to those skilled in the art. Accordingly, it is to be understood that a system and method for aligning circuits constructed according to principles of this disclosure may be embodied other than as specifically described herein. The invention is also defined in the following claims, and equivalents thereof.

What is claimed is:

1. An assembly, comprising:
   a first semiconductor chip;
   a substrate; and
   a first alignment element,
   wherein the alignment of the first semiconductor chip and the substrate is determined at least in part by engagement of the first alignment element with a first recessed alignment feature, in a surface of the first semiconductor chip and extending part way through the first semiconductor chip, and
   wherein the first alignment element is a pin elongated along an axis, a first end of the pin being secured in a hole in the substrate, and the axis extending from the substrate to the first semiconductor chip.

2. The assembly of claim 1, wherein the first recessed alignment feature has a face aligned with a crystalline plane of the first semiconductor chip.

3. The assembly of claim 2, wherein the first recessed alignment feature has the shape of a pyramid or of a truncated pyramid.

4. The assembly of claim 2, wherein the first recessed alignment feature has the shape of a V-groove or of a truncated V-groove.

5. The assembly of claim 1, wherein the elongated pin is a cylindrical pin.

6. The assembly of claim 5, wherein a second end of the cylindrical pin is hemispherical and engages the first recessed alignment feature.

7. The assembly of claim 6, wherein the first semiconductor chip is a photonic integrated circuit having an optical interface and an electrical interface, the photonic integrated circuit being configured to convert optical signals to electrical signals or to convert electrical signals to optical signals.

8. The assembly of claim 7, further comprising an interface integrated circuit connected to the electrical interface of the photonic integrated circuit, and connected, through a land grid array and through a socket, to the substrate.

9. The assembly of claim 7, wherein the first recessed alignment feature has the shape of a pyramid or of a truncated pyramid.

10. The assembly of claim 7, wherein the first recessed alignment feature has the shape of a V-groove or of a truncated V-groove.

11. The assembly of claim 6, further comprising a photonic integrated circuit, wherein:
    the photonic integrated circuit has an optical interface and an electrical interface, and is configured to convert optical signals to electrical signals or to convert electrical signals to optical signals.

12. The assembly of claim 11, comprising an interface integrated circuit connected to the electrical interface of the photonic integrated circuit, and connected, through land grid array and through a socket, to the substrate.

13. The assembly of claim 12, wherein the first alignment element extends through the socket.

14. The assembly of claim 12, wherein:
    the first semiconductor chip is a carrier; and
    the interface integrated circuit and the photonic integrated circuit are secured to the carrier.

15. The assembly of claim 14, wherein the photonic integrated circuit has an active surface facing the carrier, and
    a second alignment element engages:
    a second recessed alignment feature, in the photonic integrated circuit, and
    a third recessed alignment feature, in the carrier.

16. The assembly of claim 15, wherein the first recessed alignment feature has the shape of a pyramid or of a truncated pyramid.

17. The assembly of claim 15, wherein the first recessed alignment feature has the shape of a V-groove or of a truncated V-groove.

18. The assembly of claim 15, wherein the second recessed alignment feature has the shape of a pyramid or of a truncated pyramid.

19. The assembly of claim 15, wherein the second recessed alignment feature has the shape of a V-groove or of a truncated V-groove.

20. The assembly of claim 15, wherein an angle between a sloped surface of the second recessed alignment feature and the active surface is between 50 degrees and 60 degrees.

21. An assembly, comprising:
    a first semiconductor chip;
    a substrate; and
    a first alignment element,
    wherein the alignment of the first semiconductor chip and the substrate is determined at least in part by engagement of the first alignment element with a first recessed alignment feature, in a surface of the first semiconductor chip and extending part way through the first semiconductor chip, wherein the first alignment element is a cylindrical pin extending along an axis and having:
   a first end at one end of the axis and that is secured in a hole in the substrate; and
   a second end at another end of the axis and that is round and engages the first recessed alignment feature.

22. An assembly, comprising:
a first semiconductor chip;
a substrate; and
a first alignment element,
wherein the alignment of the first semiconductor chip and the substrate is determined at least in part by engagement of the first alignment element with a first recessed alignment feature, in a surface of the first semiconductor chip,
wherein the first alignment element is an elongated pin having a first end secured in a hole in the substrate,
wherein:
   the first semiconductor chip is a photonic integrated circuit having an optical interface and an electrical interface, the photonic integrated circuit being configured to convert optical signals to electrical signals or to convert electrical signals to optical signals; or
   the assembly further comprises a photonic integrated circuit having an optical interface and an electrical interface, and being configured to convert optical signals to electrical signals or to convert electrical signals to optical signals, and
wherein the assembly further comprises an interface integrated circuit connected to the electrical interface of the photonic integrated circuit, and connected, through a land grid array and through a socket, to the substrate.

* * * * *